United States Patent
Fu

(10) Patent No.: US 10,993,328 B2
(45) Date of Patent: Apr. 27, 2021

(54) MODULE-EMBEDDED MULTILAYER CIRCUIT BOARD AND METHOD FOR MANUFACTURING THE SAME

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventor: Chih-Chieh Fu, New Taipei (TW)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 56 days.

(21) Appl. No.: 16/585,792

(22) Filed: Sep. 27, 2019

(65) Prior Publication Data
US 2021/0037653 A1    Feb. 4, 2021

(30) Foreign Application Priority Data
Jul. 30, 2019    (CN) .......................... 201910697477.2

(51) Int. Cl.
*H05K 1/18*    (2006.01)
*H05K 1/11*    (2006.01)
(Continued)

(52) U.S. Cl.
CPC ............. *H05K 1/187* (2013.01); *H05K 1/115* (2013.01); *H05K 3/421* (2013.01); *H05K 3/429* (2013.01);
(Continued)

(58) Field of Classification Search
CPC ...... H05K 1/187; H05K 3/4682; H05K 1/115; H05K 3/421; H05K 3/429; H05K 3/4652;
(Continued)

(56) References Cited

U.S. PATENT DOCUMENTS 7,319,599 B2 *    1/2008    Hirano ...................... H01G 4/40
                                                                361/763
7,514,636 B2 *    4/2009    Sasaki ................. H01L 23/3107
                                                                174/252

(Continued)

*Primary Examiner* — Sherman Ng
(74) *Attorney, Agent, or Firm* — ScienBiziP, P.C.

(57) ABSTRACT

A module-embedded multilayer circuit board includes an inner circuit board, component embedded module embedded in the through opening, a first outer circuit board, and a second outer circuit board. A through opening is defined in the inner circuit board. The component embedded module includes a top surface and side surfaces. The top surface has a length greater than that of the two side surfaces. Each component embedded module includes a component, upper circuit patterns formed on the top surface, and side circuit patterns formed on the side surface and exposed from the through opening. The first and the second outer circuit board are formed on the inner circuit board. One end of the side circuit patterns is electrically connected to the first and the second outer circuit board, the other end of the side circuit patterns is electrically connected to the component by the upper circuit patterns, respectively.

17 Claims, 10 Drawing Sheets

(51) Int. Cl.
*H05K 3/46* (2006.01)
*H05K 3/42* (2006.01)
(52) U.S. Cl.
CPC ......... *H05K 3/4652* (2013.01); *H05K 3/4682* (2013.01); *H05K 2201/09509* (2013.01); *H05K 2203/0228* (2013.01); *H05K 2203/0278* (2013.01)
(58) Field of Classification Search
CPC . H05K 2203/0278; H05K 2201/09509; H05K 2203/0228
USPC ........................................................ 361/761
See application file for complete search history.

(56) References Cited

U.S. PATENT DOCUMENTS

| | | | | |
|---|---|---|---|---|
| 7,719,851 | B2* | 5/2010 | Tuominen | H01L 24/18 361/761 |
| 2008/0180930 | A1* | 7/2008 | Shih | H05K 1/185 361/809 |
| 2012/0063108 | A1* | 3/2012 | Kim | H05K 1/0231 361/783 |
| 2014/0166343 | A1* | 6/2014 | Kim | H05K 1/185 174/251 |
| 2014/0285988 | A1* | 9/2014 | Sawatari | H05K 1/183 361/761 |
| 2014/0353017 | A1* | 12/2014 | Noda | H05K 1/185 174/257 |
| 2015/0124416 | A1* | 5/2015 | Lin | H05K 1/183 361/761 |

* cited by examiner

MODULE-EMBEDDED MULTILAYER CIRCUIT BOARD AND METHOD FOR MANUFACTURING THE SAME

FIELD

The present disclosure relates to a module-embedded multilayer circuit board and method for manufacturing the module-embedded multilayer circuit board.

BACKGROUND

In recent years, light, thin and small electronic products are becoming more and more popular. As a main component of electronic products, flexible circuit boards occupy a large space of electronic products, which affects the size of electronic products.

To reduce the size of the flexible circuit board, passive components can be embedded in the flexible circuit board. The embedded passive components can bean inductor component, a capacitor component, and a resistor component. The passive component is embedded by placing the passive component horizontally in a cavity and then adding layers thereon. If there are many passive components to be embedded, a plurality of cavities need to be defined, and the circuit board needs sufficient horizontal size to accommodating the cavities which may resulting in an insufficient flexibility in product design. In addition, a width and a length of the embedded passive component may be larger than a thickness of the embedded component, which can further increase the horizontal size of the circuit board.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION OF EMBODIMENTS

Figure 1:
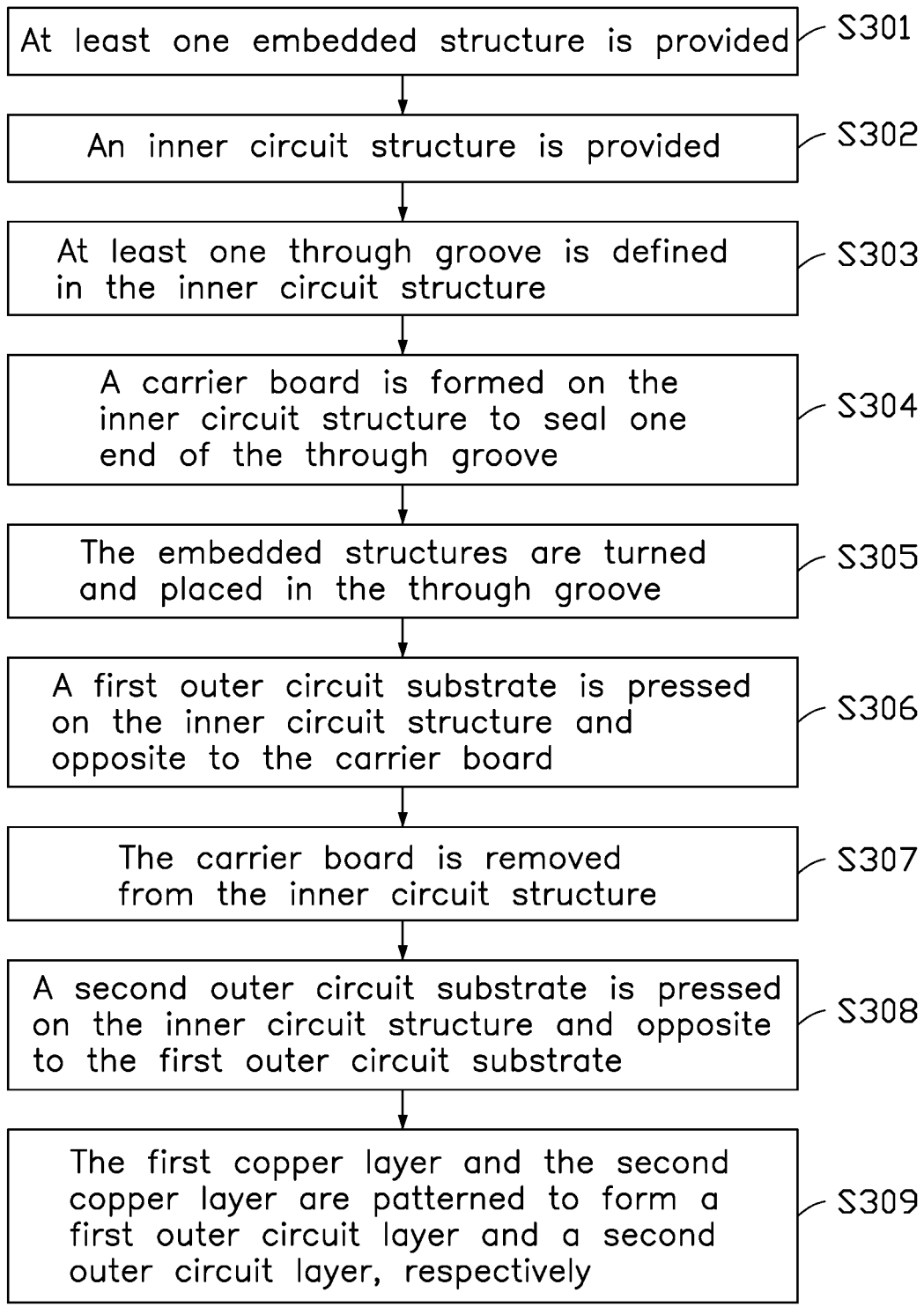
FIG. 1 is a flowchart of a method for manufacturing a module-embedded multilayer circuit board in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure Several definitions that apply throughout this disclosure will now be presented.

The term "comprising," when utilized, means "including, but not necessarily limited to"; it specifically indicates open-ended inclusion or membership in the so-described combination, group, series, and the like.

FIG. 1 illustrates a flow chart of a method for manufacturing a module-embedded multilayer circuit board 100 in accordance with an embodiment of the present disclosure. The example method is provided by way of example, as there are a variety of ways to carry out the method. The method described below can be carried out using the configurations illustrated in FIGS. 2-11, for example, and various elements of these figures are referenced in explaining example method. Each block shown in FIG. 1 represents one or more processes, methods, or subroutines, carried out in the example method. Additionally, the illustrated order of blocks is by example only and the order of the blocks can change. The example method can begin at block 301.

Figure 2:
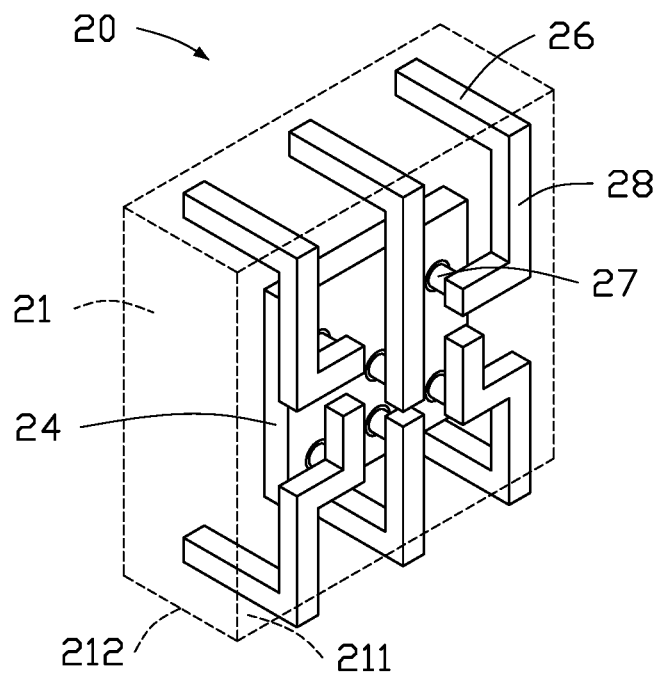
FIG. 2 is a view of a component embedded module of the module-embedded multilayer circuit board in FIG. 1.
Figure 3:
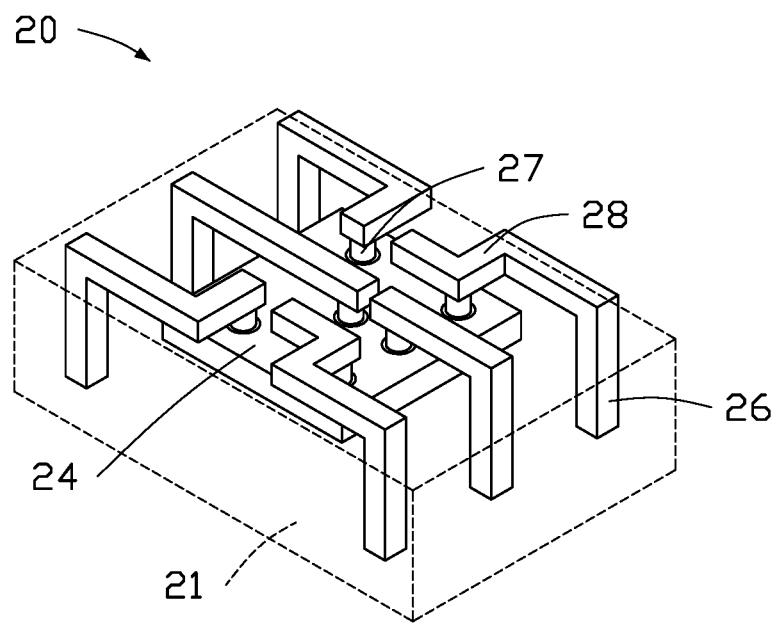
FIG. 3 is a view of the component embedded module of FIG. 2 from another angle.

At block 301, referring to FIGS. 2-3, at least one component embedded module 20 is provided.

The at least one component embedded module 20 includes at least one dielectric layer 21, a component 24, at least two upper circuit patterns 28, and two groups of side circuit patterns 26.

the at least one dielectric layer 21 includes a top surface 211 and at least two side surfaces 212 connected to the top surface 211. The top surface 211 has a length greater than a height of the side surfaces 212.

The component 24 is embedded in the at least one dielectric layer 21.

The component 24 is at least one of an active element, a passive element, a copper block, and a substrate with circuits. In at least one embodiment, the component 24 is an active element. When the component 24 is a copper block, the copper block can also dissipate heat generated by the at least two upper circuit patterns 28.

The at least two upper circuit patterns 28 are formed on the top surface 211 and are electrically connected to the component 24 by at least two first conductive holes 27. The two groups of side circuit patterns 26 are embedded in the at least one dielectric layer 21, set on two opposite sides of the component 24, exposed from the side surfaces 212, and electrically connected to the at least two upper circuit patterns 28. One first embedded circuit 28 is electrically connected to one second embedded circuit 26.

In at least one embodiment, the at least one component embedded module 20 includes six upper circuit patterns 28 and six side circuit patterns 26. The six side circuit patterns 26 are divide into two groups. The two groups of side circuit patterns 26 are embedded in the at least one dielectric layer 21, set on two opposite sides of the component 24, and exposed from the side surfaces 212. One end of one second embedded circuit 26 is electrically connected to one end of one first embedded circuit 28. In other embodiment, the numbers of the side circuit patterns 26 and the at least two upper circuit patterns 28 may be designed according to actual needs, and are not limited to six.

Figure 4:
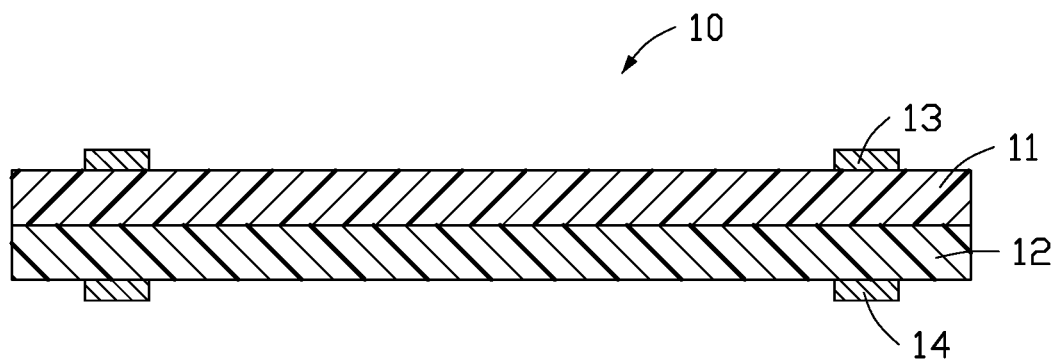
FIG. 4 is a cross-sectional view of an inner circuit board of the module-embedded multilayer circuit board in FIG. 1.

At block 302, referring to FIG. 4, an inner circuit board 10 is provided.

The inner circuit board 10 includes at least one inner substrate layer and at least one inner circuit layer. The at least one inner substrate layer and the at least one inner circuit layer are alternately stacked together.

In at least one embodiment, the inner circuit board 10 includes a first inner substrate layer 11, a second inner substrate layer 12 stacked on the first inner substrate layer 11, a first inner circuit layer 13 formed on the first inner substrate layer 11, and a second inner circuit layer 14 formed on the second inner substrate layer 12. In other embodiment, the inner circuit board 10 further includes more inner substrate layers and more inner circuit layers.

Figure 5:
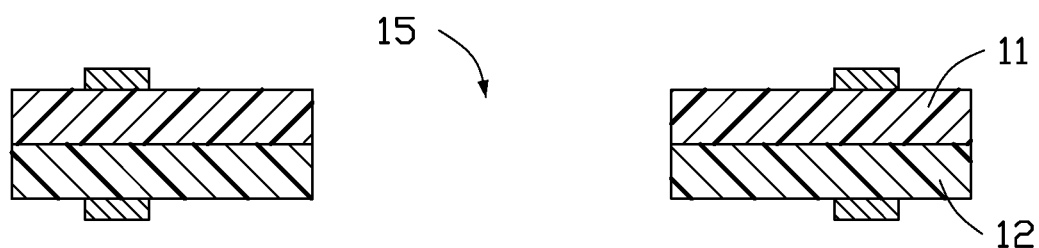
FIG. 5 is a cross-sectional view showing at least one through groove is defined in the inner circuit board of FIG. 4.

At block 303, referring to FIG. 5, at least one through opening 15 is defined in the inner circuit board 10.

The at least one through opening 15 penetrates the inner circuit board. In at least one embodiment, the at least one through opening 15 penetrates the first inner substrate layer 11 and the second inner substrate layer 12.

The at least one through opening 15 can be formed by mechanical drilling, laser drilling, or other method.

Figure 6:
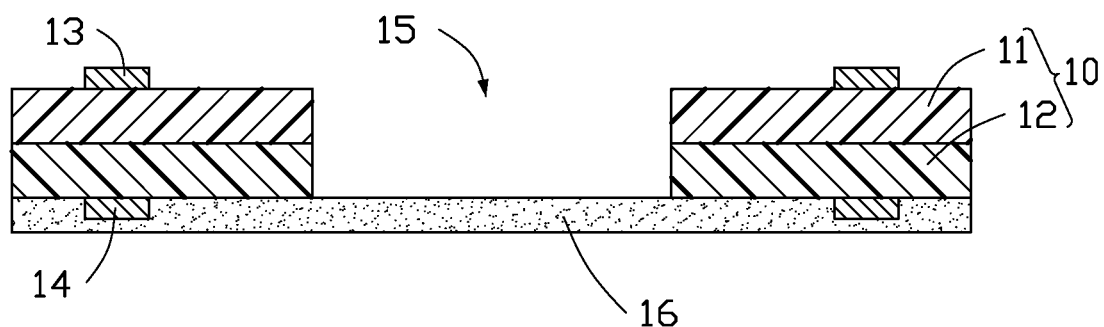
FIG. 6 is a cross-sectional view showing an insulating carrier is formed on the inner circuit board of FIG. 5.

At block 304, referring to FIG. 6, an insulating carrier 16 is formed on the inner circuit board 10 to seal one end of the at least one through opening 15.

The insulating carrier 16 is formed on one inner substrate layer. One inner circuit layer is embedded in the insulating carrier 16. In at least one embodiment, the insulating carrier 16 is formed on the second inner substrate layer 12 and the second inner circuit layer 14. The second inner circuit layer 14 is embedded in the insulating carrier 16.

In at least one embodiment, the insulating carrier 16 is a peelable adhesive.

Figure 7:
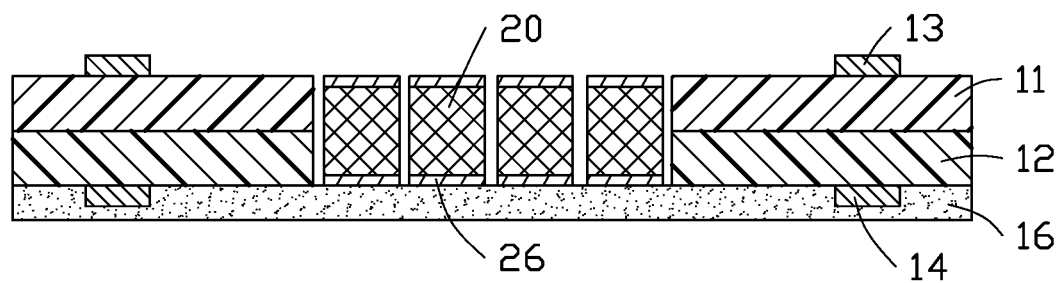
FIG. 7 is a cross-sectional view showing the component embedded module of FIGS. 2-3 is embedded in the inner circuit board of FIG. 6.

At block 305, referring to FIG. 7, the component embedded modules 20 are turned and placed in the at least one through opening 15.

One group of side circuit patterns 26 touches with the insulating carrier 16.

Figure 8:
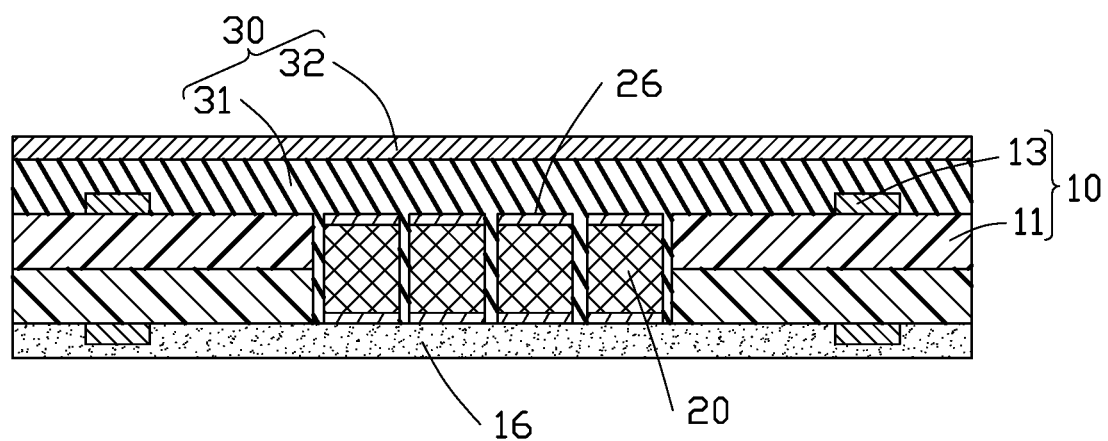
FIG. 8 is a cross-sectional view showing a first single-sided copper clad laminate is formed on the inner circuit board of FIG. 7.

At block 306, referring to FIG. 8, a first single-sided copper clad laminate 30 is pressed on the inner circuit board 10 and opposite to the insulating carrier 16.

The other group of side circuit patterns 26 faces the first single-sided copper clad laminate 30.

In at least one embodiment, the first single-sided copper clad laminate 30 includes a first outer substrate layer 31 formed on the first inner substrate layer 11 and a first copper layer 32 formed on the first outer substrate layer 31. The other group of side circuit patterns 26 faces the first outer substrate layer 31.

When the first single-sided copper clad laminate 30 is pressed on the first inner substrate layer 11, a portion of the first outer substrate layer 31 is filled in gaps between two adjacent component embedded modules 20.

In other embodiment, the first single-sided copper clad laminate 30 further includes more first outer substrate layer 31 and at least one first outer circuit layer 33 formed on the first outer substrate layer 31.

In other embodiment, the first single-sided copper clad laminate 30 just includes at least one first outer substrate layer 31 and at least one first outer circuit layer 33, not includes first copper layer 32. At this moment, the first single-sided copper clad laminate 30 also can be called first outer circuit structure 110.

Figure 9:
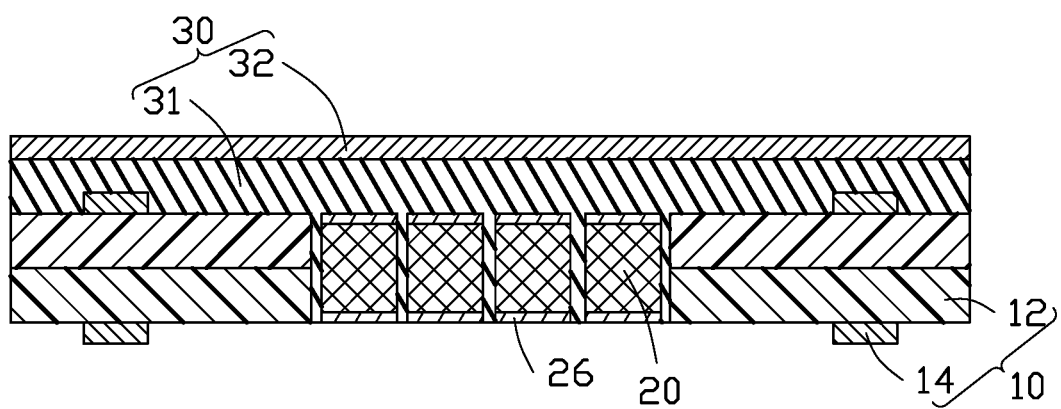
FIG. 9 is a cross-sectional view showing the insulating carrier is removed from the inner circuit board of FIG. 8.

At block 307, referring to FIG. 9, the insulating carrier 16 is removed from the inner circuit board 10.

Figure 10:
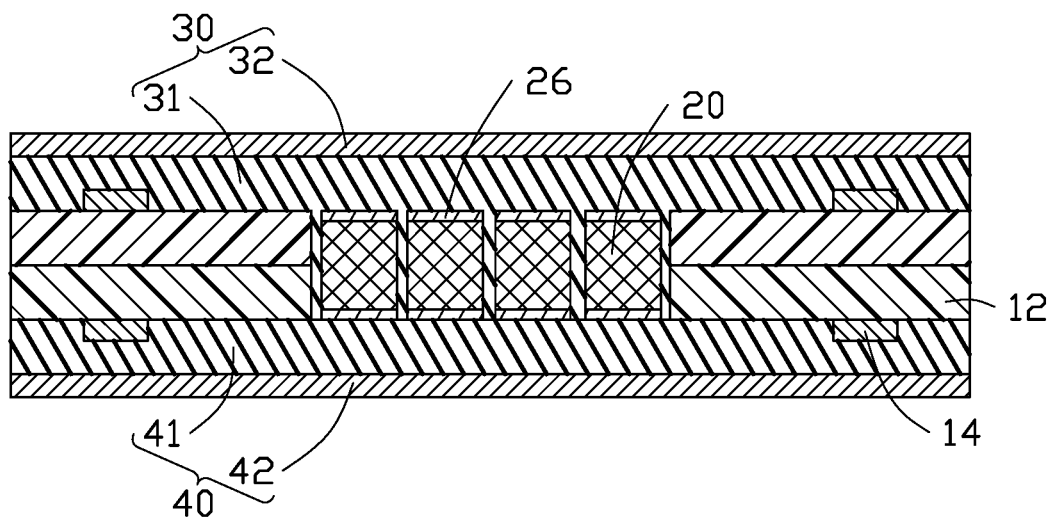
FIG. 10 is a cross-sectional view showing a second single-sided copper clad laminate is formed on the inner circuit board of FIG. 9.

At block 308, referring to FIG. 10, a second single-sided copper clad laminate 40 is pressed on the inner circuit board 10 and opposite to the first single-sided copper clad laminate 30.

One group of side circuit patterns 26 faces the first single-sided copper clad laminate 30.

In at least one embodiment, the second single-sided copper clad laminate 40 includes a second outer substrate layer 41 formed on the second inner substrate layer 12 and a second copper layer 42 formed on the second outer substrate layer 41. One group of side circuit patterns 26 faces the second outer substrate layer 41.

In other embodiment, the second single-sided copper clad laminate 40 further includes more second outer substrate layer 41 and at least one second outer circuit layer 43 formed on the second outer substrate layer 41.

In other embodiment, the second single-sided copper clad laminate 40 just includes at least one second outer substrate layer 41 and at least one second outer circuit layer 43, not includes the second copper layer 42. At this moment, the second single-sided copper clad laminate 40 also can be called second outer circuit structure 120.

Figure 11:
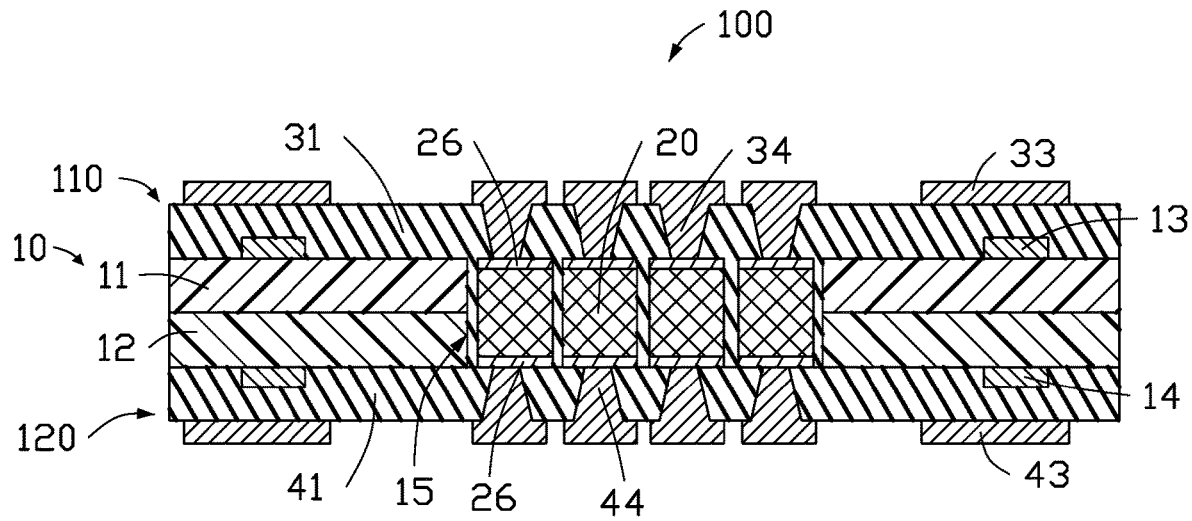
FIG. 11 is a cross-sectional view of a module-embedded multilayer circuit board.

At block 309, referring to FIG. 11, the first copper layer 32 and the second copper layer 42 are patterned to form a first outer circuit layer 33 and a second outer circuit layer 43, respectively.

The first outer circuit layer 33 and the second outer circuit layer 43 are electrically connected to the two groups of side circuit patterns 26 by at least one second conductive block 34 and at least one third conductive block 44, respectively.

In other embodiments, the module-embedded multilayer circuit board 100 may be further layered on the first outer circuit structure 110 and the second outer circuit structure 120 according to actual needs.

In other embodiments, there is no particular order between the step at block 301 and the step at block 302.

In other embodiments, the step at block 304 can be omitted. The step at block 306 comes before the step at block 305.

FIG. 11 shows a module-embedded multilayer circuit board 100. The module-embedded multilayer circuit board 100 includes an inner circuit board 10, at least one first outer circuit structure 110, at least one second outer circuit structure 120, and at least one component embedded module 20. The at least one first outer circuit structure 110 and the at least one second outer circuit structure 120 are formed on two opposite surface of the inner circuit board 10, respectively. The at least one component embedded module 20 is embedded in the inner circuit board 10 and is electrically connected to the at least one first outer circuit structure 110 and the at least one second outer circuit structure 120, respectively.

The inner circuit board 10 includes at least one inner substrate layer and at least one inner circuit layer. The inner substrate layer and the inner circuit layer are alternately stacked together. The inner circuit board 10 further includes at least one through opening 15 defined in the inner substrate layer. The at least one component embedded module 20 is embedded in the at least one through opening 15 and faces the at least one first outer circuit structure 110 and the at least one second outer circuit structure 120, respectively.

In at least one embodiment, each of the at least one inner circuit board 10 includes a first inner substrate layer 11, a second inner substrate layer 12 stacked on the first inner substrate layer 11, a first inner circuit layer 13 formed on the first inner substrate layer 11, and a second inner circuit layer 14 formed on the second inner substrate layer 12. The at least one through opening 15 penetrates the first inner substrate layer 11 and the second inner substrate layer 12.

In other embodiment, each of the at least one inner circuit board 10 further includes more inner substrate layers and more inner circuit layers.

Each of the at least one first outer circuit structure 110 includes at least one first outer substrate layer 31 and at least one first outer circuit layer 33. The first outer substrate layer 31 and the first outer circuit layer 33 are alternately stacked together. One first outer substrate layer 31 is formed on one first outer circuit layer 33. One group of side circuit patterns 26 is electrically connected to the first outer circuit layer 33 by at least one second conductive block 34 and faces the first outer substrate layer 31.

In at least one embodiment, each of the at least one first outer circuit structure 110 includes a first outer substrate layer 31 and a first outer circuit layer 33. The first outer substrate layer 31 is formed on the first inner substrate layer 11 and the first inner circuit layer 13. The first outer circuit layer 33 is formed on the first outer substrate layer 31. The first inner circuit layer 13 is embedded in the first outer substrate layer 31.

In other embodiment, each of the at least one first outer circuit structure 110 further includes more first outer substrate layers and more first outer circuit layers.

Each of the at least one second outer circuit structure 120 includes at least one second outer substrate layer 41 and at least one second outer circuit layer 43. The second outer substrate layer 41 and the second outer circuit layer 423 are alternately stacked together. One second outer substrate layer 41 is formed on one second inner circuit layer 43. The other group of side circuit patterns 26 is electrically connected to the second outer circuit layer 43 by at least one third conductive block 44 and faces the second outer substrate layer 41.

In at least one embodiment, each of the at least one second outer circuit structure 120 includes a second outer substrate layer 41 and a second outer circuit layer 43. The second outer substrate layer 41 is formed on the second inner substrate layer 12 and the second inner circuit layer 14. The second outer circuit layer 43 is formed on the second outer substrate layer 41. The second inner circuit layer 43 is embedded in the second outer substrate layer 41.

In other embodiment, each of the at least one second outer circuit structure 120 further includes more second outer substrate layers and more second outer circuit layers.

The first inner substrate layer 11, the second inner substrate layer 12, the first outer substrate layer 31, and the second outer substrate layer 41 are made from a flexible resin such as polyimide (PI), or polyethylene terephthalate (PET), or polyethylene naphthalate (PEN), or the like.

Referring to FIGS. 2-3, the at least one component embedded module 20 includes at least one dielectric layer 21, a component 24, at least two upper circuit patterns 28, and two groups of side circuit patterns 26.

the at least one dielectric layer 21 includes a top surface 211 and at least two side surfaces 212 connected to the top surface 211. The top surface 211 has a length greater than a height of the side surfaces 212.

The component 24 is embedded in the at least one dielectric layer 21.

The component 24 is at least one of an active element, a passive element, a copper block, and a substrate with a line. In at least one embodiment, the component 24 is an active element. When the component 24 is a copper block, the copper block can also dissipate heat generated by the at least two upper circuit patterns 28.

The at least two upper circuit patterns 28 are formed on the top surface 211 and are electrically connected to the component 24 by at least two first conductive holes 27. The two groups of side circuit patterns 26 are embedded in the at least one dielectric layer 21, set on two opposite sides of the component 24, exposed from the side surfaces 212, and electrically connected to the at least two upper circuit patterns 28. One first embedded circuit 28 is electrically connected to one second embedded circuit 26. When the at least one component embedded module 20 is embedded in the at least one through opening 15, the top surface 211 is perpendicular to the first inner substrate layer 11, and the side surfaces 212 are parallel to the first inner substrate layer 11. One group of side circuit patterns 26 is electrically connected to the first outer circuit layer 33 and faces the first outer substrate layer 31. The other group of side circuit patterns 26 is electrically connected to the second outer circuit layer 43 and faces the second outer substrate layer 41.

In at least one embodiment, the at least one component embedded module 20 includes six upper circuit patterns 28 and six side circuit patterns 26. The six side circuit patterns 26 are divide into two groups. The two groups of side circuit patterns 26 are embedded in the at least one dielectric layer 21, set on two opposite sides of the component 24, and exposed from the side surfaces 212. One end of one second embedded circuit 26 is electrically connected to one end of one first embedded circuit 28. In other embodiment, the numbers of the side circuit patterns 26 and the at least two upper circuit patterns 28 may be designed according to actual needs, and are not limited to six.

Figure 12:
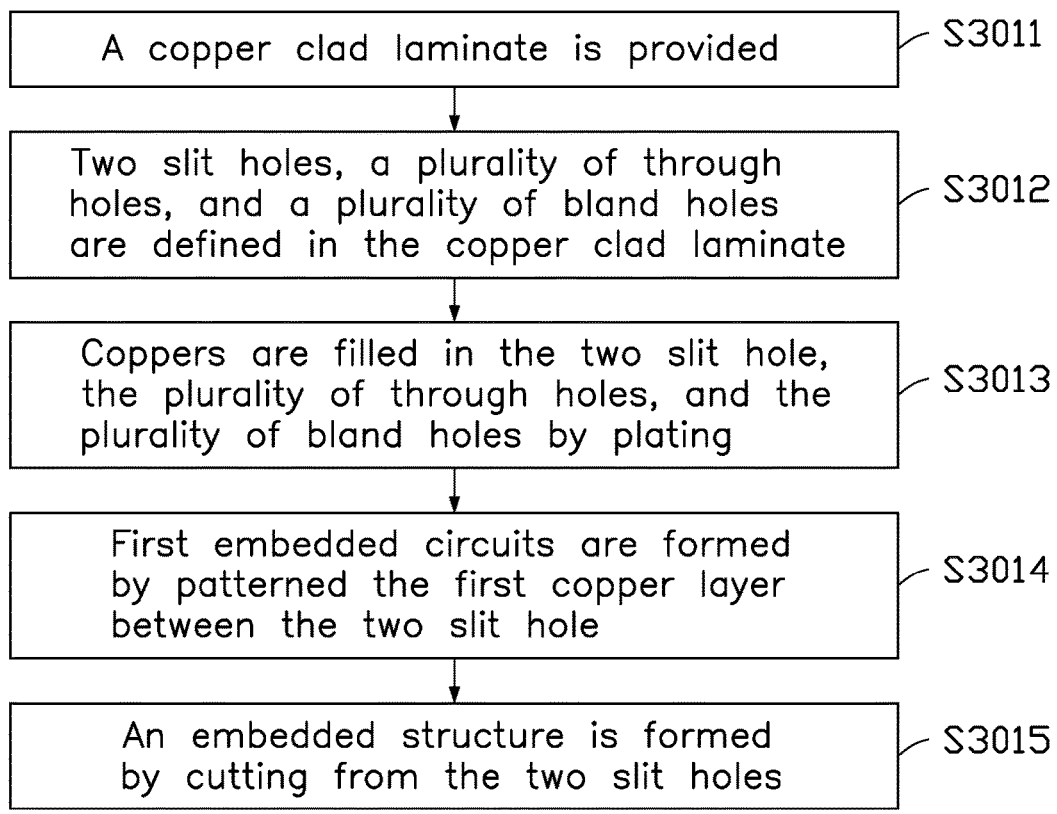
FIG. 12 is a flowchart of a method for manufacturing the component embedded module of FIGS. 2-3 in accordance with an embodiment.

FIG. 12 illustrates a flow chart of a method for manufacturing an component embedded module 20 in accordance with an embodiment of the present disclosure. The example method is provided by way of example, as there are a variety of ways to carry out the method. The method described below can be carried out using the configurations illustrated in FIGS. 13-17B, for example, and various elements of these figures are referenced in explaining example method. Each block shown in FIG. 5 represents one or more processes, methods, or subroutines, carried out in the example method. Additionally, the illustrated order of blocks is by example only and the order of the blocks can change. The example method can begin at block 3011.

Figure 13:
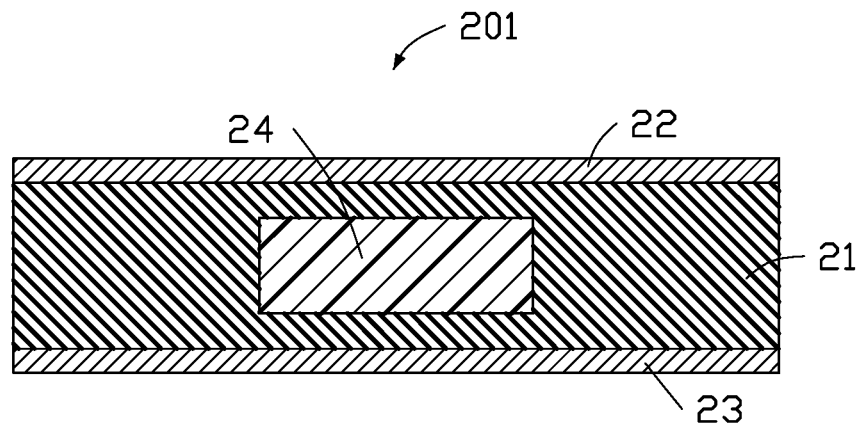
FIG. 13 is a cross-sectional view of a circuit board intermediate structure.

At block 3011, referring to FIG. 13, a circuit board intermediate structure 201 is provided.

In at last one embodiment, the circuit board intermediate structure 201 includes at least one dielectric layer 21, a first copper layer 22, a second copper layer 23, and a component 24. The first copper layer 22 and the second copper layer 23 are formed on two opposite surfaces of the at least one dielectric layer 21, respectively. The component 24 is embedded in the at least one dielectric layer 21.

the at least one dielectric layer 21 is made from a flexible resin such as PI, or PET, or PEN, or the like.

The second copper layer 23 is used to enhance the rigidity of the copper clad laminate 201. In other embodiment, the second copper layer 23 can be omitted or replaced by a carrier plate.

Figure 14A:
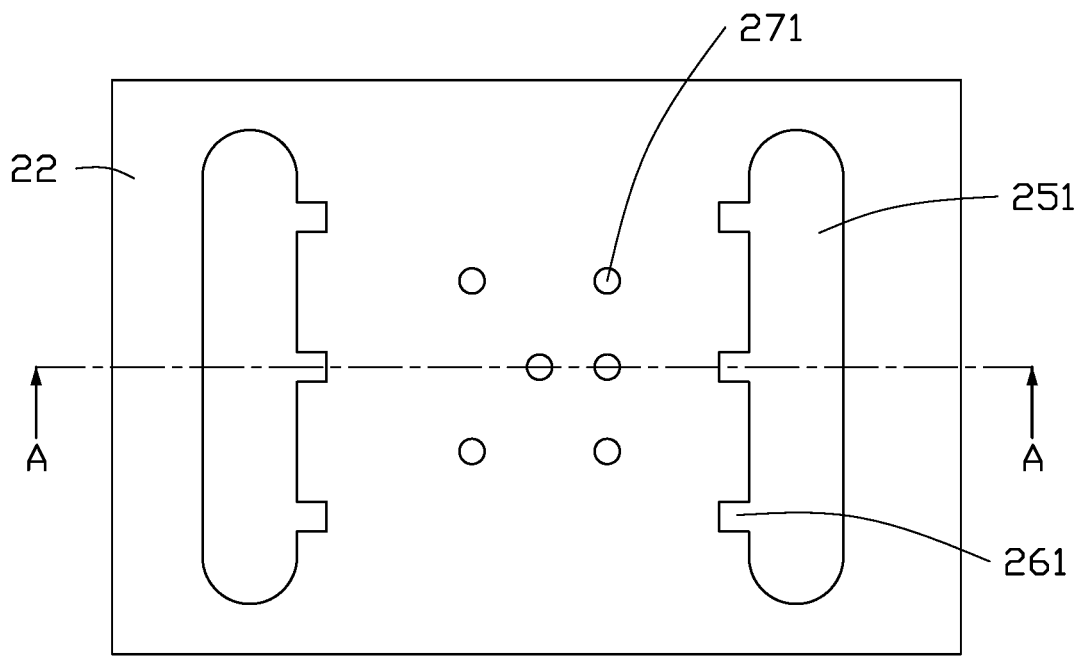
FIG. 14A is a top view showing two through groove, a plurality of through holes, and a plurality of blind holes are defined in the circuit board intermediate structure of FIG. 13.
Figure 14B:
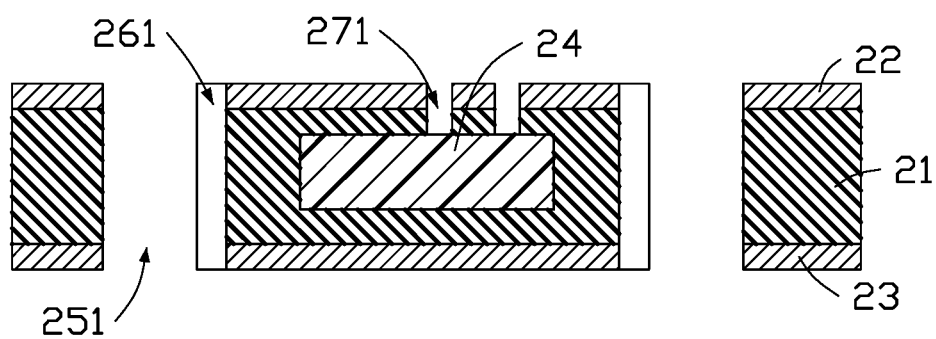
FIG. 14B is a cross-sectional view along line A-A of FIG. 14A.

At block 3012, referring to FIGS. 14A-14B, two through grooves 251, a plurality of through holes 261, and a plurality of blind holes 271 are defined in the copper clad laminate 201.

The two through grooves 251 are defined on two opposite sides of the component 24 and penetrate the at least one dielectric layer 21. The plurality of through holes 261 is defined between the through grooves 251 and the plurality of blind holes 271, abuts and connected with the two through grooves 251, and penetrates the at least one dielectric layer 21. The plurality of blind holes 271 is defined between the plurality of through holes 261, faces the component 24, and penetrates a portion of the at least one dielectric layer 21. A portion of the at least one dielectric layer 21 is exposed from the plurality of blind holes 271.

Figure 15A:
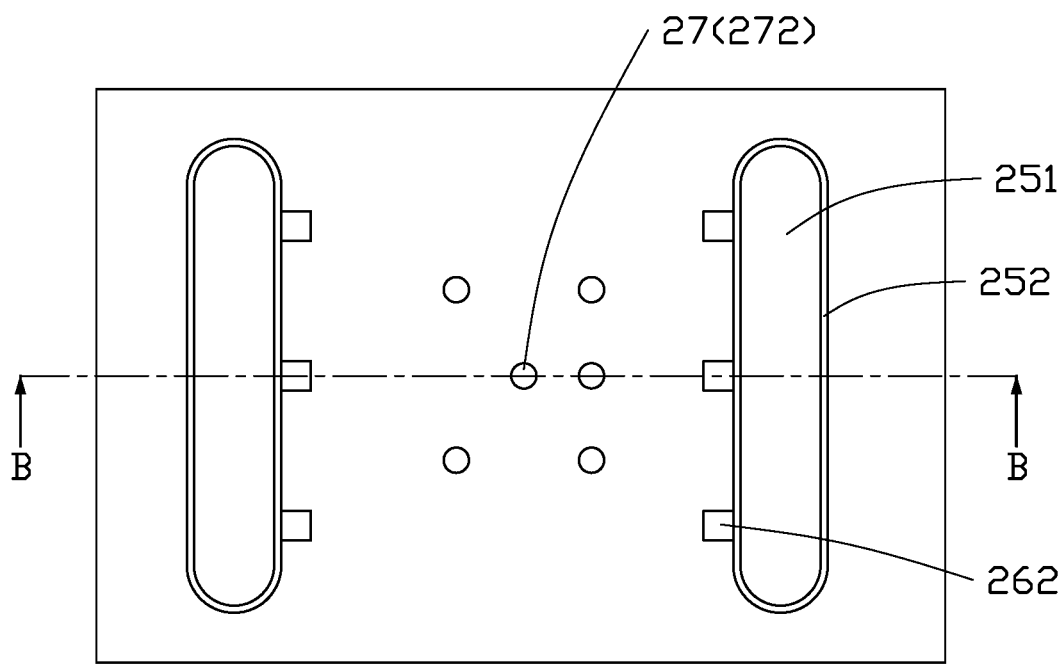
FIG. 15A is a top view showing a copper is filled in the two through groove, the plurality of through holes, and the plurality of blind holes of FIG. 14A.
Figure 15B:
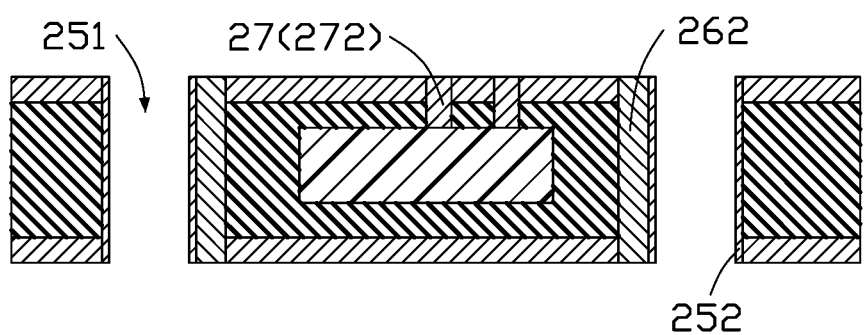
FIG. 15B is a cross-sectional view along line B-B of FIG. 15A.

At block 3013, referring to FIGS. 15A-15B, coppers 252, 262, and 272 are filled in the two through groove 251, the plurality of through holes 261, and the plurality of blind holes 271 by plating.

The coppers 272 in the plurality of blind holes 271 are also called first conductive block 27.

Figure 16A:
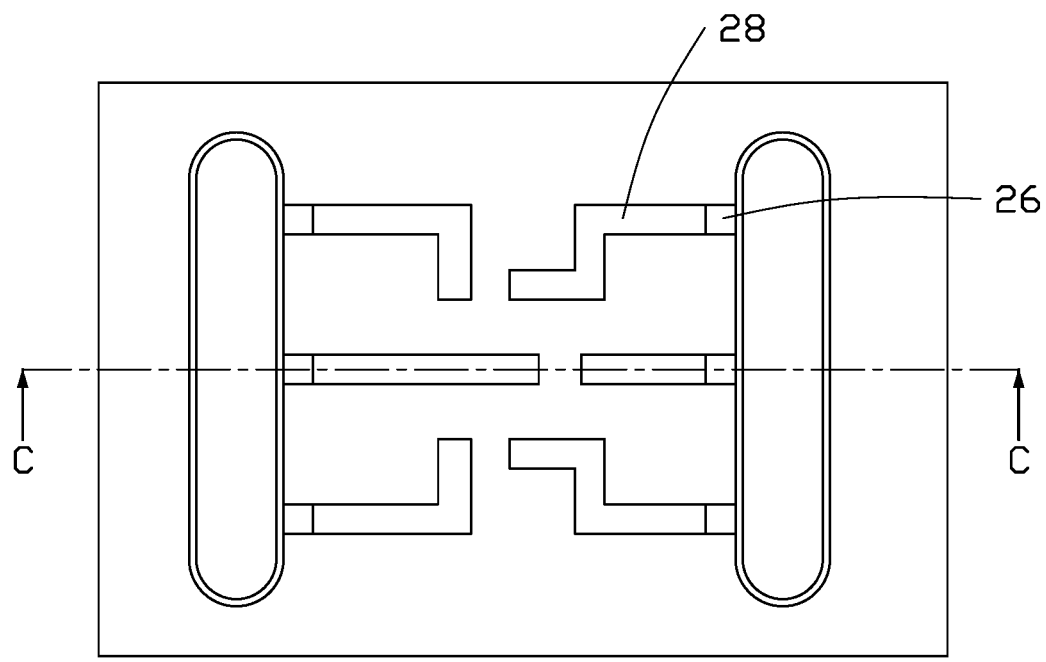
FIG. 16A is a top view showing upper circuit patterns are formed by patterned the first copper layer between the two through groove of FIG. 15A.
Figure 16B:
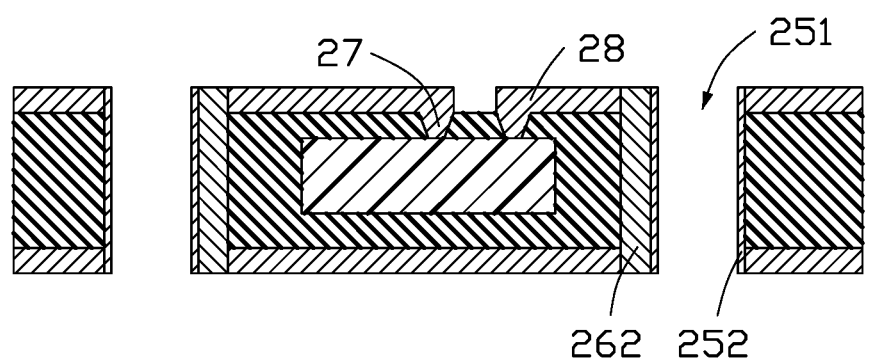
FIG. 16B is a cross-sectional view along line C-C of FIG. 16A.

At block 3014, referring to FIGS. 16A-16B, at least two upper circuit patterns 28 are formed by patterning the first copper layer 22 between the two through grooves 251.

The second copper layer 23 is wiped off at the same time.

Figure 17A:
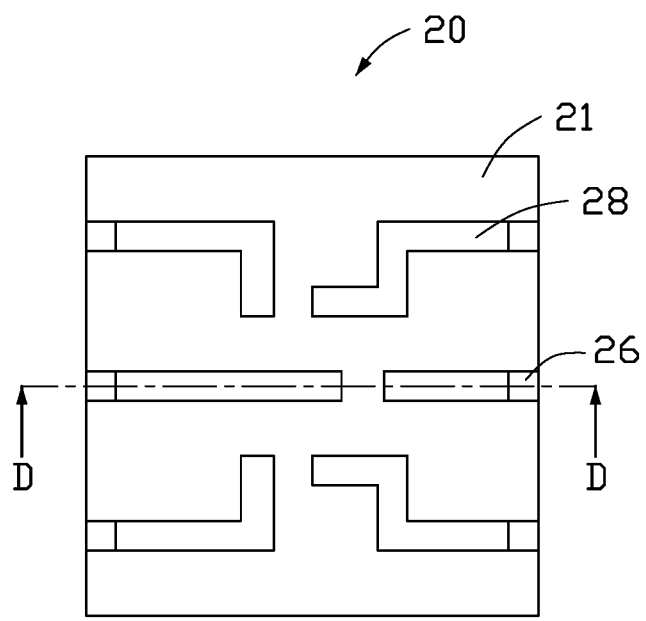
FIG. 17A is a top view showing an component embedded module is formed by cutting the circuit board intermediate structure from the through groove.
Figure 17B:
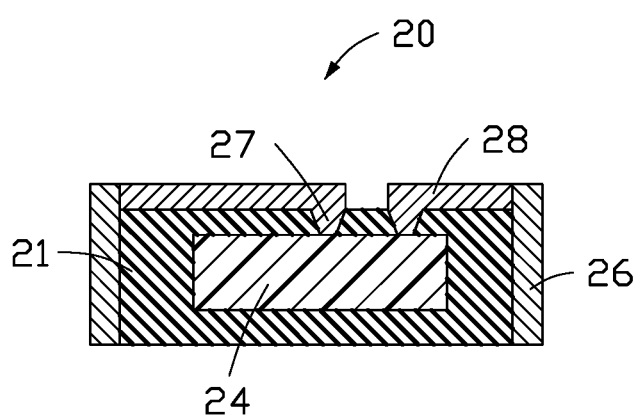
FIG. 17B is a cross-sectional view along line D-D of FIG. 17A.

At block 3015, referring to FIGS. 17A-17B, the circuit board intermediate structure 201 is cut from the two through grooves 251 to get an component embedded module 20. The coppers 262 in the plurality of through holes 261 are exposed from the at least one dielectric layer 21 to form two groups of side circuit patterns 26.

With the above configuration, 1) the at least one component embedded module 20 is embedded into the inner circuit board 10, which can greatly reduce the occupied area of the module-embedded multilayer circuit board 100 in the direction (X/Y), thereby increasing the flexibility of the product design; 2) two groups of side circuit patterns 26 are formed on the at least one component embedded module 20 and electrically connected to the outer circuits of the outer circuit structure can increase the flexibility of product design; 3) the at least one component embedded module 20 is vertically embedded in the module-embedded multilayer circuit board, so that, a plurality of component embedded modules 20 can be placed in a same through opening 15 without increasing the horizontal area of the module-embedded multilayer circuit board 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A module-embedded multilayer circuit board, comprising:
    an inner circuit board, wherein at least one through opening is defined in the inner circuit board;
    at least one component embedded module embedded in the at least one through opening; wherein the component embedded module comprises a top surface and at least two side surfaces connected to the top surface, the top surface has a length greater than that of each of the two side surfaces; wherein each of the at least one component embedded module comprises a component, at least two upper circuit patterns, and two groups of side circuit patterns; the at least two upper circuit patterns are formed on the top surface; the two groups of side circuit patterns are formed on the side surface and exposed from the through opening of the inner circuit board;
    at least one first outer circuit board; and
    at least one second outer circuit board; wherein the first outer circuit board and the second outer circuit board are formed on two opposite surfaces of the inner circuit board; one end of the two groups of side circuit patterns is electrically connected to the at least one first outer circuit board and the at least one second outer circuit board, the other end of the two groups of side circuit patterns is electrically connected to the component by the at least two upper circuit patterns, respectively.

2. The module-embedded multilayer circuit board of claim 1, wherein the component embedded module further comprises at least one dielectric layer, the component is embedded in the at least one dielectric layer; the at least two upper circuit patterns are electrically connected to the component; and the two groups of side circuit patterns set on two opposite sides of the component, exposed from the at least two side surfaces, and electrically connected to the at least two upper circuit patterns.

3. The module-embedded multilayer circuit board of claim 2, wherein the at least two upper circuit patterns are electrically connected to the component by at least two first conductive holes.

4. The module-embedded multilayer circuit board of claim 2, wherein one of the at least two first embedded circuit is electrically connected to one of the two groups of second embedded circuit.

5. The module-embedded multilayer circuit board of claim 2, wherein the component is at least one of an active element, a passive element, a copper block, and a substrate with circuits.

6. The module-embedded multilayer circuit board of claim 1, wherein each of the at least one first outer circuit board comprises at least one first outer substrate layer and at least one first outer circuit layer alternately stacked on the at least one first outer substrate layer, one group of side circuit patterns is electrically connected to the at least one first outer circuit layer and faces the at least one first outer substrate layer.

7. The module-embedded multilayer circuit board of claim 6, wherein one group of side circuit patterns is electrically connected to the at least one first outer circuit layer by at least one second conductive block.

8. The module-embedded multilayer circuit board of claim 6, wherein each of the at least one second outer circuit board comprises at least one second outer substrate layer and at least one second outer circuit layer alternately stacked on the at least one second outer substrate layer; the other group of side circuit patterns is electrically connected to the at least one second outer circuit layer and faces the at least one second outer substrate layer.

9. The module-embedded multilayer circuit board of claim 8, wherein the other group of side circuit patterns is electrically connected to the at least one second outer circuit layer by at least one third conductive block.

10. A method for manufacturing a module-embedded multilayer circuit board, comprising:
providing at least one component embedded module; wherein the component embedded module comprises a top surface and at least two side surfaces connected to the top surface, the top surface has a length greater than that of each of the two side surfaces; wherein each of the at least one component embedded module comprises a component, dielectric layers, at least two upper circuit patterns, and two groups of side circuit patterns; the at least two upper circuit patterns are formed on the top surface; the two groups of side circuit patterns are formed on the side surface;
providing an inner circuit board, wherein at least one through opening is defined in the inner circuit board;
placing the at least one component embedded module in the at least one through opening; wherein the two groups of side circuit patterns are exposed from the through opening of the inner circuit board;
pressing at least one first outer circuit board on the inner circuit board; wherein the first outer circuit board is formed on a surface of the inner circuit board, one end of one group side circuit patterns is electrically connected to the at least one first outer circuit board, the other end of one group side circuit patterns is electrically connected to the component by the at least two upper circuit patterns, respectively;
pressing at least one second outer circuit board on the inner circuit board; wherein the second outer circuit board is formed on the other surface of the inner circuit board, one end of the other group side circuit patterns is electrically connected to the at least one second outer circuit board, the other end of the other group of side circuit patterns is electrically connected to the component by the at least two upper circuit patterns, respectively.

11. The method of claim 10, wherein before placing the component embedded module in the through opening, further comprises:

forming an insulating carrier on the inner circuit board to seal one end of the at least one through opening; wherein when the at least one component embedded module is placed in the at least one through opening, one group of side circuit patterns touches with the insulating carrier.

12. The method of claim 11, wherein before pressing at least one second outer circuit board on the inner circuit board, further comprises:
removing the insulating carrier from the inner circuit board.

13. The method of claim 10, wherein a method for manufacturing one of the at least one component embedded module, comprises:
providing a circuit board intermediate structure, wherein the circuit board intermediate structure comprises a dielectric layer and a first copper layer formed on the at least one dielectric layer;
defining two through grooves, a plurality of through holes, and a plurality of blind holes in the circuit board intermediate structure; wherein the two through grooves penetrate the at least one dielectric layer; the plurality of through holes is defined between the through grooves and the plurality of blind holes, abuts and is connected with the two through grooves, and penetrates the at least one dielectric layer; the plurality of blind holes penetrates a portion of the at least one dielectric layer; a portion of the at least one dielectric layer is exposed from the plurality of blind holes;
plating a copper in the two through groove, the plurality of through holes, and the plurality of blind holes;
forming at least two upper circuit patterns by patterning the first copper layer between the two through grooves; and
cutting the circuit board intermediate structure from the two through grooves to get the component embedded module; wherein the coppers in the plurality of through holes are exposed from the at least one dielectric layer to form two groups of side circuit patterns.

14. The method of claim 13, wherein the component embedded module further comprises a component embedded in the at least one dielectric layer; the at least two upper circuit patterns are electrically connected to the component by the coppers in the plurality of blind holes; and the plurality of through holes is defined on two opposite sides of the component.

15. A method for manufacturing an module-embedded multilayer circuit board, comprising:
providing at least one component embedded module; wherein the component embedded module comprises a top surface and at least two side surfaces connected to the top surface, the top surface has a length greater than that of each of the two side surfaces; wherein each of the at least one component embedded module comprises a component, dielectric layers, at least two upper circuit patterns, and two groups of side circuit patterns; the at least two upper circuit patterns are formed on the top surface; the two groups of side circuit patterns are formed on the side surface;
providing an inner circuit board, wherein at least one through opening is defined in the inner circuit board;
pressing at least one first outer circuit board on a surface of the inner circuit board;
placing the at least one component embedded module in the at least one through opening; one end of one group side circuit patterns is electrically connected to the at least one first outer circuit board, the other end of one group side circuit patterns is electrically connected to the component by the at least two upper circuit patterns, respectively; and pressing at least one second outer circuit board on the inner circuit board; wherein the second outer circuit board is formed on the other surface of the inner circuit board, one end of the other group side circuit patterns is electrically connected to the at least one second outer circuit board, the other end of the other group of side circuit patterns is electrically connected to the component by the at least two upper circuit patterns, respectively.

16. The method of claim 15, wherein a method for manufacturing one of the at least one component embedded module, comprises:

providing a circuit board intermediate structure, wherein the circuit board intermediate structure comprises a dielectric layer and a first copper layer formed on the at least one dielectric layer;

defining two through grooves, a plurality of through holes, and a plurality of blind holes in the circuit board intermediate structure; wherein the two through grooves penetrate the at least one dielectric layer; the plurality of through holes is defined between the through grooves and the plurality of blind holes, abuts and is connected with the two through grooves, and penetrates the at least one dielectric layer; the plurality of blind holes penetrates a portion of the at least one dielectric layer; a portion of the at least one dielectric layer is exposed from the plurality of blind holes;

plating a copper in the two through groove, the plurality of through holes, and the plurality of blind holes;

forming at least two upper circuit patterns by patterning the first copper layer between the two through grooves; and cutting the circuit board intermediate structure from the two through grooves to get the component embedded module; wherein the coppers in the plurality of through holes are exposed from the at least one dielectric layer to form two groups of side circuit patterns.

17. The method of claim 16, wherein the component embedded module further comprises a component embedded in the at least one dielectric layer; the at least two upper circuit patterns are electrically connected to the component by the coppers in the plurality of blind holes; and the plurality of through holes is defined on two opposite sides of the component.

* * * * *